US007657699B2

(12) United States Patent
Murin et al.

(10) Patent No.: US 7,657,699 B2
(45) Date of Patent: Feb. 2, 2010

(54) DEVICE AND METHOD FOR MONITORING OPERATION OF A FLASH MEMORY

(75) Inventors: Mark Murin, Kfar Saba (IL); Mark Shlick, Ganey Tikva (IL)

(73) Assignee: Sandisk IL Ltd. (IL)

( * ) Notice: Subject to any disclaimer, the term of this patent is extended or adjusted under 35 U.S.C. 154(b) by 58 days.

(21) Appl. No.: 11/399,343

(22) Filed: Apr. 7, 2006

(65) Prior Publication Data
US 2007/0106834 A1 May 10, 2007

Related U.S. Application Data

(60) Provisional application No. 60/734,708, filed on Nov. 9, 2005.

(51) Int. Cl.
*G06F 13/00* (2006.01)
(52) U.S. Cl. ...................................... 711/103
(58) Field of Classification Search ........................ None
See application file for complete search history.

(56) References Cited

U.S. PATENT DOCUMENTS

| | | | | |
|---|---|---|---|---|
| 5,574,850 A | * | 11/1996 | Fandrich | 714/5 |
| 5,619,453 A | * | 4/1997 | Roohparvar et al. | 365/185.33 |
| 5,966,723 A | * | 10/1999 | James et al. | 711/103 |
| 6,189,070 B1 | * | 2/2001 | See et al. | 711/103 |
| 2005/0204091 A1 | * | 9/2005 | Kilbuck et al. | 711/103 |

OTHER PUBLICATIONS

Notification Concerning Transmittal of International Preliminary Report on Patentability and Written Opinion of the International Searching Authority dated Mar. 19, 2009 in PCT Application No. PCT/IL2006/001281.

* cited by examiner

*Primary Examiner*—Reginald G Bragdon
*Assistant Examiner*—Larry T Mackall
(74) *Attorney, Agent, or Firm*—Vierra Magen Marcus & DeNiro LLP

(57) ABSTRACT

A flash memory device includes an array of memory cells for storing data pages, at least one buffer (e.g. a memory buffer and a cache buffer) for transferring the data pages to and from the array of memory cells and a host, and an output pin. A logic mechanism is operative to select, from among a plurality of conditions related to an operation on the array of memory cells, a condition that drives a signal being output on the output pin. A data page transfer by the host is contingent on the signal being output on the output pin.

23 Claims, 1 Drawing Sheet

DEVICE AND METHOD FOR MONITORING OPERATION OF A FLASH MEMORY

CROSS-REFERENCE TO RELATED APPLICATIONS

This patent application claims the benefit of U.S. Provisional Patent Application No. 60/734,708, filed Nov. 9, 2005.

FIELD OF THE INVENTION

The present invention relates generally to a method for efficiently monitoring operation of a flash memory device.

BACKGROUND OF THE INVENTION

Flash memory devices have been known for many years. Standard flash memory devices known in the art store data in a memory array, arranged in groups, called pages and/or blocks.

An example of a NAND flash memory device known in the art is Samsung Electronics device No. K9K4G08U1M. The Data Sheet (herein under—DS) of this device is incorporated by reference for all purposes as if fully set forth herein.

When exchanging data with a flash memory, an entire data page is usually written to the memory array or read out of it simultaneously, within one operation, from/to an internal buffer (or register) called a page buffer. A Host device, which the flash memory device is connected to, transfers the data to/from this page buffer.

The process of reading data from the flash memory device is carried out in two phases. In the first phase, data is transferred from the memory array to the page buffer of the flash memory device. In the second phase, data is transferred from the page buffer to the Host device.

The process of writing data to the flash memory device is carried out in two phases as well, such that in the first phase data is transferred from the Host device to the page buffer of the flash memory device and in the second phase data is transferred from the page buffer to the memory array.

Data transfer between the Host device and the page buffer is controlled by the Host device's hardware and/or software modules, and so the start and finish of this data transfer is directly controlled by these modules. However, the data transfer between the page buffer and the memory array is usually performed autonomously by the flash memory device, without intervention of the Host device. Therefore, the Host device's hardware and/or software modules are not aware of such transfer timing.

Because the data transfer between the page buffer and the memory array is time consuming (this phase lasts between tens to hundreds of microseconds), a special notification of a busy memory array is provided to the Host device. This notification is implemented as a "Ready/Busy" hardware signal, produced by the flash memory device and monitored by the Host device.

On top of the implementation of a hardware signal, the above mentioned notification of a busy memory array may further be available to the Host device software within status information via a "status register".

For example, the hardware signal may generate an interrupt to the Host device upon completion of an operation, indicating that the flash memory device is ready for executing a new operation or, alternatively, the Host device's software module may poll the memory status register, waiting for this event.

The time spent for data exchange between the Host device and the flash memory device includes both Host ⇌ Buffer and Buffer ⇌ Memory Array transfer periods. As the data page size of existing flash memory devices increases, the Host ⇌ Buffer transfer time increases as well, and becomes comparable to the Buffer ⇌ Memory Array transfer time. For example, in a NAND flash memory device known in the art having a 2 KByte data page, the Host ⇌ Buffer transfer time is typically 50 to 100 microseconds per page, while Buffer ← Memory Array page read time is 20 to 50 microseconds per page and Buffer → Memory Array page program (write) time is 200 to 800 microseconds per page.

Therefore, in order to increase the system's throughput, some flash memory devices include an additional data buffer —a cache buffer for enabling a simultaneous data transfer between the Host device and this cache buffer and between the page buffer and the memory array.

It should be noted, that the NAND flash memory device whose data sheet is incorporated by reference herein implements a cache buffer for page programming only, however, there are other devices, which use it for a read operation as well.

In order to provide the Host device with the necessary transfer timing information and to achieve time efficiency, existing flash memory devices which include such a cache buffer include two logical "Ready/Busy" indications. The first indication, defined "Cache Ready/Busy" (or just "Ready/Busy"), is for indicating the availability of the cache buffer regarding the data transfer. The second indication, defined "True Ready/Busy", is for indicating the current state of the memory array.

Practically, Host devices need to use both indications. While the "Cache Ready/Busy" indication is used to trigger next data transfer in a series, the "True Ready/Busy" indication is used to indicate whether the current operation running in the flash memory device has finished, the memory array is free, and a different operation may be started. This may happen when there is a need to switch from page read to page program or vice versa, or when the application needs to know that the current page programming indeed finished (page data is in the memory array, not only in a buffer) and next step in the application may start.

However, in flash memory devices known in the art only the "Cache Ready/Busy" indication is handled in a "hardware manner" (i.e. provided as a hardware "Ready/Busy" signal), by generating an interrupt to the application, as an example, whereas the "True Ready/Busy" indication is only polled by the Host device's software module, thus increasing the complexity of this module and decreasing its flexibility and time-efficiency.

One option to handle this situation is to implement the two logical "Ready/Busy" indications to be output by the flash memory device as hardware signals.

However, such an approach is impractical, because it violates the standard NAND flash interface and introduces lack of compatibility to similar devices which do not include a cache.

Existing methods for monitoring operation of flash memory devices do not implement the two logical "Ready/Busy" indications in a "hardware" manner.

There is thus a widely recognized need for, and it would be highly advantageous to have, a flash memory device and method for monitoring operation of the flash memory device, which is an alternative approach to prior art techniques, such that the flash memory device is compliant to a standard NAND flash interface.

SUMMARY OF THE INVENTION

Accordingly, it is a principal object of the present invention to disclose an alternative method to prior art techniques used for monitoring operation of a flash memory device.

The present invention is an innovative flash memory device and method for monitoring operation of the flash memory device, while providing two logical "Ready/Busy" indications implemented in a "hardware" manner as a single hardware signal, such that the flash memory device is compliant to a standard NAND flash interface.

The flash memory device of the present invention includes a logic mechanism that is operative to change the logical meaning of a signal (i.e. the condition that invokes the signal) being output on an output pin between a plurality of signals according to a request asserted from a Host.

In accordance with the present invention, there is provided a flash memory device including: (a) an array of memory cells for storing data pages; (b) at least one buffer for transferring the data pages to and from the array of memory cells and a host; (c) an output pin; and (d) a logic mechanism that is operative to select, from among a plurality of conditions related to an operation on the array of memory cells, a condition that drives a signal being output on the output pin.

Preferably, the condition that drives the signal being output on the output pin is that the array of memory cells is busy (i.e. the array of memory cells is engaged in being addressed for reading, programming, updating, erasing, etc.) or that one buffer is busy (i.e. the memory buffer is engaged in being addressed for reading, programming, updating, erasing, etc.). Preferably, the condition is a compound condition (i.e. a Boolean combination of two other conditions), for example—that the array of memory cells is busy and that one buffer (e.g. the memory buffer) is busy, the array of memory cells is busy or the memory buffer is busy, the array of memory cells is not busy and the memory buffer is busy, the array of memory cells is not busy or the memory buffer is busy, the array of memory cells is busy and the memory buffer is not busy, the array of memory cells is busy or the memory buffer is not busy, the array of memory cells is not busy and the memory buffer is not busy, the array of memory cells is not busy or the memory buffer is not busy.

Optionally, the condition that invokes the signal being output on the output pin is a failure of an operation.

Optionally, the condition that invokes the signal being output on the output pin may be a logical operational state, such as a page program failure, a block erase failure, etc.

Preferably, the logic mechanism selects the condition according to at least one command received from a host. Alternatively, the command operates the logic mechanism to toggle the condition each time the command is received. Also preferably, the change persists until the flash memory device receives a reset command or until the flash memory device is powered up. Obviously, the command is also overridden by a subsequent command even without a reset command or a power up. Also preferably, the change persists for only one write/erase operation before returning to operate in default mode. Also preferably, the logic mechanism selects the condition according the command received from the host, such that each command corresponds to a different respective condition (e.g. set by a respective parameter).

In accordance with the present invention, there is further provided a method for monitoring operation of a flash memory device, the method including the steps of: (a) sending a command to the flash memory device instructing the flash memory device to select a condition, from among a plurality of conditions, under which a state of an output pin changes; and (b) interrogating the condition by sensing the changed state of the output pin.

Preferably, a data page transfer by the host is contingent on the interrogation of the selected condition.

Preferably, the condition is that an array of memory cells is busy, that a buffer (e.g. a memory buffer) is busy or a compound condition (for example, that the array of memory cells is (is not) busy and/or that the memory buffer is (is not) busy).

Preferably, the condition is a failure of an operation.

Preferably, the condition that invokes the signal being output on the output pin may be a logical operational state, such as a page program failure, a block erase failure, etc.

Additional features and advantages of the invention will become apparent from the following drawings and description.

BRIEF DESCRIPTION OF THE DRAWINGS

For a better understanding of the invention with regard to the embodiment thereof, reference is made to the accompanying drawing, in which like numerals designate corresponding sections or elements throughout, and in which:

The SOLE FIGURE is a block diagram of the preferred flash memory device of the present invention.

DETAILED DESCRIPTION OF THE PREFERRED EMBODIMENTS

Figure 1:
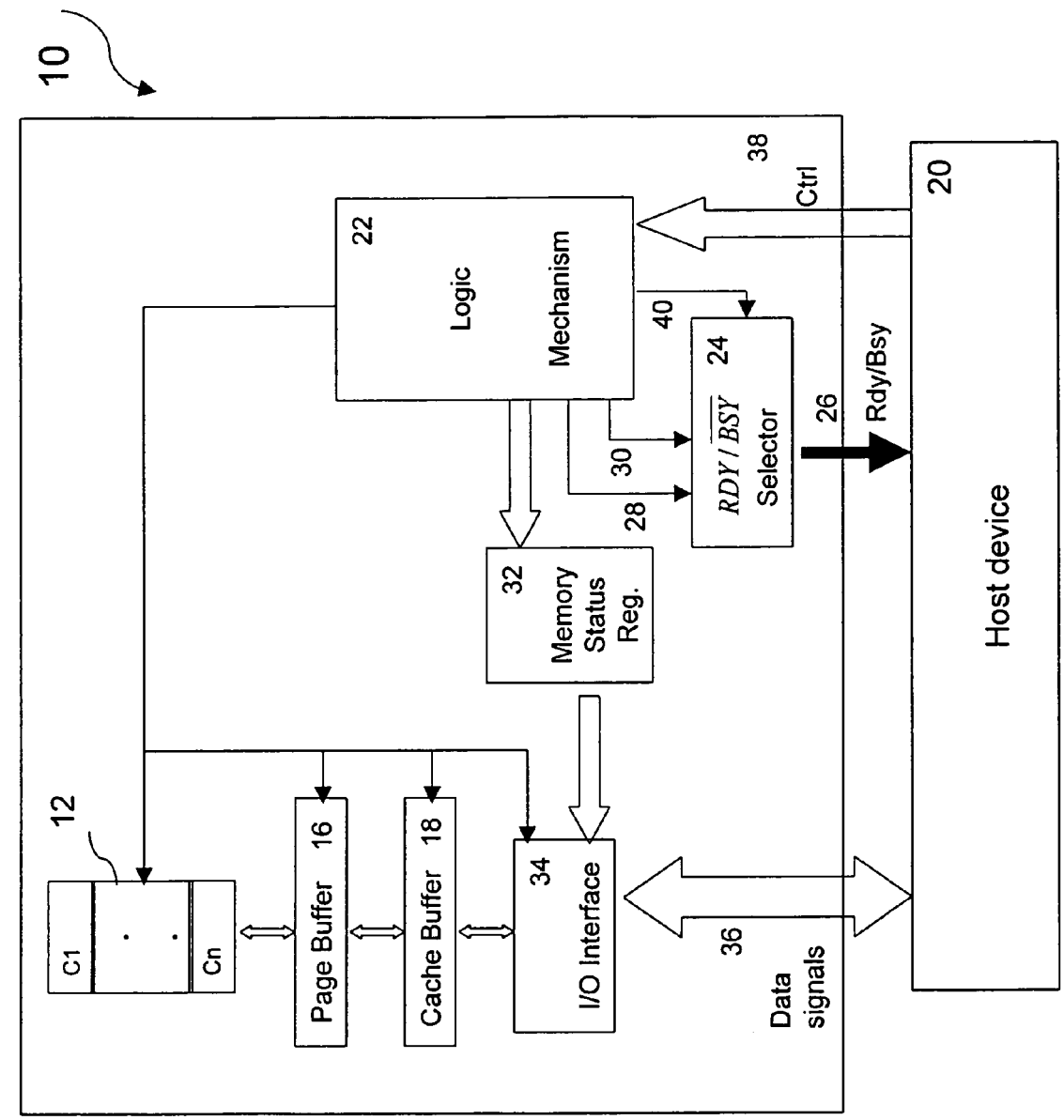

The present invention is an innovative flash memory device and method for monitoring operation of the flash memory device, while providing two logical "Ready/Busy" indications implemented in a "hardware" manner as a single hardware signal, such that the flash memory device is compliant to a standard NAND flash interface.

The flash memory device of the present invention includes a logic mechanism that is operative to select, optionally by a request asserted from a Host, a condition that drives a signal being output on an output pin. The condition is selected from among a plurality of conditions that are related to an operation on an array of memory cells being a busy condition after an operation or a failure indication after an operation, as an example.

As an example for usage of such a "Ready/Busy" indication, the hardware signal may be an interrupt to the Host upon completion of an operation, indicating that the flash memory device is ready for a new operation or, alternatively, the Host may poll the memory status register for a change of status.

The flash memory device of the present invention is equally applicable to assert a hardware signal providing a "Cache Ready/Busy" indication solely, a "True Ready/Busy" indication solely or both "Cache Ready/Busy" and "True Ready/Busy" indications. The flash memory device may further select a condition that is compound condition (i.e. a Boolean combination of two other conditions), such as—that the array of memory cells is busy and that the memory buffer is busy, the array of memory cells is busy or the memory buffer is busy, the array of memory cells is not busy and the memory buffer is busy, the array of memory cells is not busy or the memory buffer is busy, the array of memory cells is busy and the memory buffer is not busy, the array of memory cells is busy or the memory buffer is not busy, the array of memory cells is not busy and the memory buffer is not busy, the array of memory cells is not busy or the memory buffer is not busy.)

Referring now to FIG. 1, there is shown a block diagram of the preferred flash memory device 10 of the present invention. Flash memory device 10 includes a memory array 12 of memory cells C1 to Cn for storing data pages. A Host device 20, which the flash memory device is connected to, transfers the data pages via Data signals 36 to/from an Input/Output (I/O) Interface unit 34.

An entire data page is written to the memory array or read out of it from/to the Page Buffer 16. Flash memory device 10 includes an additional data buffer—a Cache Buffer 18 for enabling a simultaneous data transfer between the Host device 20 and the Cache Buffer 18 and between the Page Buffer 16 and the memory array 12. The simultaneous data transfer increases the overall throughput of the flash memory device 10.

A Logic Mechanism 22 is operative to change the meaning of a RDY/$\overline{BSY}$ signal 26 being output from a RDY$\overline{BSY}$ Selector 24. Logic Mechanism 22 transfers a select signal 40 for selecting between a "True Ready/Busy" signal 28 and a "Cache Ready/Busy" signal 30. The functionality of the select signal 40 is set according to a command asserted from the Host device 20 via Control signals 38 and Data signals 36.

Status information, such as the two logical "True Ready/Busy" and "Cache Ready/Busy" indications, is further provided to the Host device 20 from a Memory Status register 32 connected to the Logic Mechanism 22. The status information is transferred from the Memory Status register 32 to the Host device 20 via the Input/Output (I/O) Interface unit 34.

In some preferred embodiments of the present invention the command asserted from the Host device 20 for changing the meaning of the RDY/$\overline{BSY}$ signal 26 operates the Logic Mechanism 22 as follows:

In one preferred embodiment there is implemented a command which toggles the meaning of the "Ready/Busy" signal each time the Host device issues this command.

In another preferred embodiment, there is provided a pair of commands, such that each command sets the RDY/$\overline{BSY}$ signal 26 a different meaning.

In a third preferred embodiment, there is provided a command including a corresponding parameter, such that the meaning of the RDY/$\overline{BSY}$ signal 26 is explicitly stated according to the parameter.

In a fourth preferred embodiment, there is provided a command which operates the Logic Mechanism 22 to change the meaning of the RDY/$\overline{BSY}$ signal 26 to a non-default state until a reset command or a power up event is encountered.

In a fifth preferred embodiment, there is provided a command which operates the Logic Mechanism 22 to change the meaning of the RDY/$\overline{BSY}$ signal 26 until the transition from a "Busy" state to a "Ready" state occurs (following such a transition, an automatic return to a previous state occurs).

The present invention is described herein as providing the two logical "Cache Ready/Busy" and "True Ready/Busy" indications. However, the present invention is not limited to these two logical indications only, and is equally applicable for indication of other logical operational states within a memory device provided in a similar manner (e.g. page program failure, block erase failure, etc.).

It should be noted that the present invention relates to a NAND flash memory device. However, it can be understood that other implementations are possible within the scope of the invention, thus relating to any device and method for monitoring operation of a flash memory device.

Having described the invention with regard to a certain specific embodiment thereof, it is to be understood that the description is not meant as a limitation, since further modifications will now suggest themselves to those skilled in the art, and it is intended to cover such modifications as fall within the scope of the appended claims.

The invention claimed is:

1. A flash memory device comprising:
   (a) an array of memory cells for storing data pages;
   (b) at least one buffer for transferring said data pages between said array of memory cells and a host;
   (c) an output pin dedicated only to having driven thereon a signal reflective of a condition from among a plurality of conditions of the flash memory device that are related to operation of said array of memory cells; and
   (d) a logic mechanism that is operative to select, in response to at least one command from a host of the flash memory device, a first condition from among said plurality of conditions, said first condition for driving said signal, said signal has a value that changes in response to changes in said first condition.

2. The flash memory device of claim 1, wherein said selected condition is that said array of memory cells is busy.

3. The flash memory device of claim 1, wherein said selected condition is that one buffer of said at least one buffer is busy.

4. The flash memory device of claim 1, wherein said selected condition is a compound condition that one or both of said array of memory cells and said buffer is busy.

5. The flash memory device of claim 1, wherein said selected condition is a failure of an operation.

6. The flash memory device of claim 1, wherein said selected condition is a logical operational state selected from the group consisting of: a page program failure and a block erase failure.

7. The flash memory device of claim 1, wherein said at least one command operates said logic mechanism to toggle said condition each time said at least one command is received.

8. The flash memory device of claim 1, wherein said logic mechanism maintains said selection until an event selected from the group consisting of: a reset command and a powering up is encountered.

9. The flash memory device of claim 1, wherein said logic mechanism maintains said selection during an activation of only a single command.

10. The flash memory device of claim 1, wherein each of said at least one command corresponds to a different respective condition.

11. A method for monitoring operation of a flash memory device, the flash device having an output pin, the method comprising the steps of:
   (a) sending a command to the flash memory device instructing the flash memory device to select a condition, from among a plurality of conditions, under which a state of an output pin changes in response to a ready/busy condition of said memory device, wherein said state of said output pin represents a single bit that is fully indicative of said selected condition until a different said single condition is selected in response to a sending of a subsequent command to the flash memory device; and
   (c) interrogating said selected condition by sensing a change in the state of said output pin that occurs in response to said ready/busy condition.

12. The method of claim 11, wherein said selected condition is a compound condition of whether one or both of a memory array of said memory device and a buffer of said memory device is busy.

13. The method of claim 11, wherein, once said single condition has been selected and until another condition of the plurality is selected, said signal indicates only said selected single condition.

14. A flash memory device comprising:
a memory array of memory cells for storing data;
a buffer for transferring said data between said memory array and a host that is external to said memory device;
an output pin, a value on the output pin indicates a ready/busy condition of the memory device, the ready busy condition is one of a plurality of ready/busy conditions of the memory device involving the memory array and the buffer; and
a logic mechanism that is operative to receive a command from the host, the command identifies a first ready/busy condition of the plurality of ready/busy conditions, the logic mechanism causes the output pin to output a first value that specifies the first ready/busy condition, the first value on the output pin changes in response to the first ready/busy condition.

15. The flash memory device of claim 14 wherein the plurality of ready/busy conditions include whether the memory array is busy and whether the buffer is busy.

16. The flash memory device of claim 14 wherein the plurality of ready/busy conditions include a ready/busy condition of the memory array, a ready/busy condition of the buffer, and a ready/busy condition that involves both the memory array and the buffer.

17. The flash memory device of claim 14, wherein the plurality of ready/busy conditions include a failure of an operation involving the memory array.

18. The flash memory device of claim 14 wherein the first signal represents a single bit that is fully indicative of the first ready/busy condition until a different single condition is selected in response to a subsequent command from the host.

19. A method of operating a flash memory device, the method comprising:
outputting a first hardware signal on a pin of the flash memory device, the first hardware signal has a value that specifies a first ready/busy condition out of a plurality of ready/busy conditions of the memory device;
receiving a command from a host of the flash memory device while the first hardware signal is being output, the command identifies a second ready/busy condition of the memory device out of the plurality of ready/busy conditions;
outputting a second hardware signal on the pin of the flash memory device in response to receiving the command, the second hardware signal has a value that specifies the second ready/busy condition;
detecting a change in the second ready/busy condition of the memory device while outputting the second hardware signal; and
changing the value of the second hardware signal on the pin to reflect the change in the second ready/busy condition.

20. The method of claim 19 wherein the plurality of ready/busy conditions include a ready/busy condition of a memory array of the memory device, a ready/busy condition of a buffer that is coupled to the memory array, and a ready/busy condition that involves both the memory array and the buffer.

21. The method of claim 20 further comprising:
receiving a unit of data from the host to be stored in the memory array;
storing the unit of data in the buffer;
transferring the unit of data from the buffer to the memory array, the first ready/busy condition is whether the buffer is busy, the second busy/ready condition is whether the memory array is busy.

22. The method of claim 20 wherein the command includes a parameter that specifies the second ready/busy condition.

23. A flash memory device comprising:
a memory array of memory cells for storing data;
a buffer for transferring said data between said memory array and a host that is external to said memory device;
a selector circuit that inputs a first hardware signal that specifies whether the memory array is busy or ready and a second hardware signal that specifies whether the buffer is busy or ready, the selector circuit is operative to form a third hardware signal that is a logical combination of whether the memory array is busy and whether the buffer is busy;
an output pin coupled to the selector circuit, the output pin is dedicated to providing a single bit value that is one of the first hardware signal, the second hardware signal, and the third hardware signal, and
a logic mechanism that is operative to receive a command from the host, the command identifies either a ready/busy condition of the memory array, a ready/busy condition of the buffer, or a logical combination of a ready/busy condition of the memory array and a ready/busy condition of the buffer, the logic mechanism controls the selector circuit to cause the output pin to output one of the first hardware signal, the second hardware signal, or the third hardware signal depending on what the command identifies.

* * * * *